(12) United States Patent
Doerrer

(10) Patent No.: US 7,903,009 B2
(45) Date of Patent: Mar. 8, 2011

(54) STARTING CIRCUIT AND METHOD FOR THE STABLE STARTING OF A CIRCUIT ARRANGEMENT WITH PLURAL FEEDBACK CONTROL CIRCUITS

(75) Inventor: Lukas Doerrer, Villach (AT)

(73) Assignee: Infineon Technologies AG, Munich (DE)

( * ) Notice: Subject to any disclaimer, the term of this patent is extended or adjusted under 35 U.S.C. 154(b) by 1165 days.

(21) Appl. No.: 11/588,871

(22) Filed: Oct. 27, 2006

(65) Prior Publication Data

US 2007/0103945 A1     May 10, 2007

(30) Foreign Application Priority Data

Oct. 28, 2005    (DE) .................. 10 2005 051 822

(51) Int. Cl.
*H03M 3/00*     (2006.01)

(52) U.S. Cl. ........................................ 341/143; 341/155

(58) Field of Classification Search .................. 341/143, 341/155

See application file for complete search history.

(56) References Cited

U.S. PATENT DOCUMENTS

| | | | | |
|---|---|---|---|---|
| 5,298,900 A * | 3/1994 | Mauthe et al. | ................. | 341/143 |
| 5,585,801 A * | 12/1996 | Thurston | ........................ | 341/143 |
| 5,727,024 A * | 3/1998 | Hauptmann | .................. | 375/247 |
| 5,777,911 A * | 7/1998 | Sherry et al. | ................... | 708/316 |
| 5,909,364 A * | 6/1999 | Rivet et al. | ...................... | 363/89 |
| 6,608,581 B1 * | 8/2003 | Semenov | ...................... | 341/155 |

FOREIGN PATENT DOCUMENTS

| | | |
|---|---|---|
| DE | 3629826 C2 | 8/1988 |
| DE | 269 700 A1 | 7/1989 |
| DE | 102004030812 A1 | 9/2005 |

* cited by examiner

*Primary Examiner* — Jean B Jeanglaude

(74) *Attorney, Agent, or Firm* — Maginot, Moore & Beck

(57) ABSTRACT

In a method for starting a circuit arrangement an output signal of a circuit arrangement with interlinked feedback control circuits is utilized as a control variable for the feedback control circuits and an input signal for the circuit arrangement is damped for a predetermined time period during a starting phase of the circuit arrangement.

18 Claims, 3 Drawing Sheets

STARTING CIRCUIT AND METHOD FOR THE STABLE STARTING OF A CIRCUIT ARRANGEMENT WITH PLURAL FEEDBACK CONTROL CIRCUITS

FIELD OF THE INVENTION

The invention relates to a starting circuit and a method that enables circuit arrangements with multiple feedback control circuits to be reliably started.

BACKGROUND

Circuit arrangements with interlinked or interconnected feedback control circuits frequently have a problem on start-up in that, because they are interdependent, the feedback control circuits block each other. In such cases the circuit arrangement then does not reach a stable operating point.

Published German application for patent No. 10 2004 030 812 A1, for example, describes a multibit delta-sigma converter that in addition to the usual outer feedback control circuit as a sigma-delta modulator also has a second inner feedback control circuit. The inner feedback control circuit consists of a quantizer as a tracking analog-digital converter.

FIG. 1 shows a corresponding sigma-delta converter. The sigma-delta converter converts an analog input signal ZA to a digital output signal ZD. To do this, a feedback signal ZF, that is subtracted from the analog input signal ZA by means of an adder, is derived from the output signal ZD by means of a device for dynamic element compensation DEM and a feedback digital-analog converter FDAC. The signal Z1 obtained in this way is applied to a filter CTF that is usually in the form of an integrator. By quantizing the filtered signal Z2 that is sampled at a clock frequency of a clock signal CLK, a digital signal ZD is obtained.

The quantizing is achieved according to published German application for patent No. 10 2004 030 812 A1 by means of a tracking analog-digital converter, that in its simplest form consists merely of a comparator, that compares the signal Z2 with an internal reference voltage ZR that is obtained from the output signal ZD by means of a digital-analog converter DAC. A counting device UDC downstream of the quantizer or comparator Q increments or decrements depending on the results of the comparison or the quantized signal Z3. The output voltage ZR of the digital-analog converter DAC also changes due to the change in this counter state.

Therefore, an outer feedback control circuit RK1 and an inner feedback control circuit RK2 are provided. Particularly after the sigma-delta converter is switched on, the difference between the two inputs of the comparator or quantizer Q is very large during the starting phase and shows as a quantizing error in the output signal ZD. On each clock pulse the counter UDC follows the value of the input signal ZA or Z2. Therefore, in the starting phase the output signal ZR of the digital-analog converter DAC approaches the signal Z2 and the quantizing error becomes smaller.

Since shortly after the sigma-delta converter is switched on the capacitors of the loop filter CTF are initially discharged and must then be recharged and further components must be brought to an operating state, it is possible that a stable operating point will not be found. Since the use of the tracking analog-digital converter means that the succeeding quantizer result depends on the preceding one, the quantizing or residual error is particularly large at the start of operation. Due to the mismatch in the coupling between the inner and outer control loops RK1, RK2, the presence of a large quantizing error in the inner loop can cause interference in the complete feedback control system RK1 so that the corresponding sigma-delta converter never finds a stable operating point.

It was therefore proposed that the tracking quantizer be operated during starting as a (reduced bit width) flash digital-analog converter, i.e. to interrupt the inner feedback loop. Immediately the circuit has reached a stable operating point, a switch to tracking mode takes place at the instant of a zero crossing of the input signal ZA. It is, of course, difficult to detect the most satisfactory switching instant for a zero-crossing signal. Especially with multitone signals, that frequently require a sigma-delta converter, this is often impossible with fast-changing signal shapes.

The problem of an unstable behavior during the starting phase can also arise if instead of a tracking quantizer an analog-digital converter using the method of successive approximation with a noise shaper or internal sigma-delta converter is used. Generally the difficulties with stability in a starting phase frequently occur where several feedback control circuits are interlinked.

SUMMARY

In one aspect of the invention, a starting circuit for the stable starting of a circuit arrangement with multiple feedback control circuits is provided, with an output signal of the circuit arrangement being used as a control variable for the feedback control circuits. Furthermore, the starting circuit has a damping device that damps an input signal for the circuit arrangement for a predetermined time period during the starting phase of the circuit arrangement.

With the method according to the invention for the stable starting of a circuit arrangement with interlinked feedback control circuits, the input signal for the circuit arrangement is damped for a predetermined time period during the starting phase of the circuit arrangement.

DETAILED DESCRIPTION OF THE INVENTION

Figure 1:
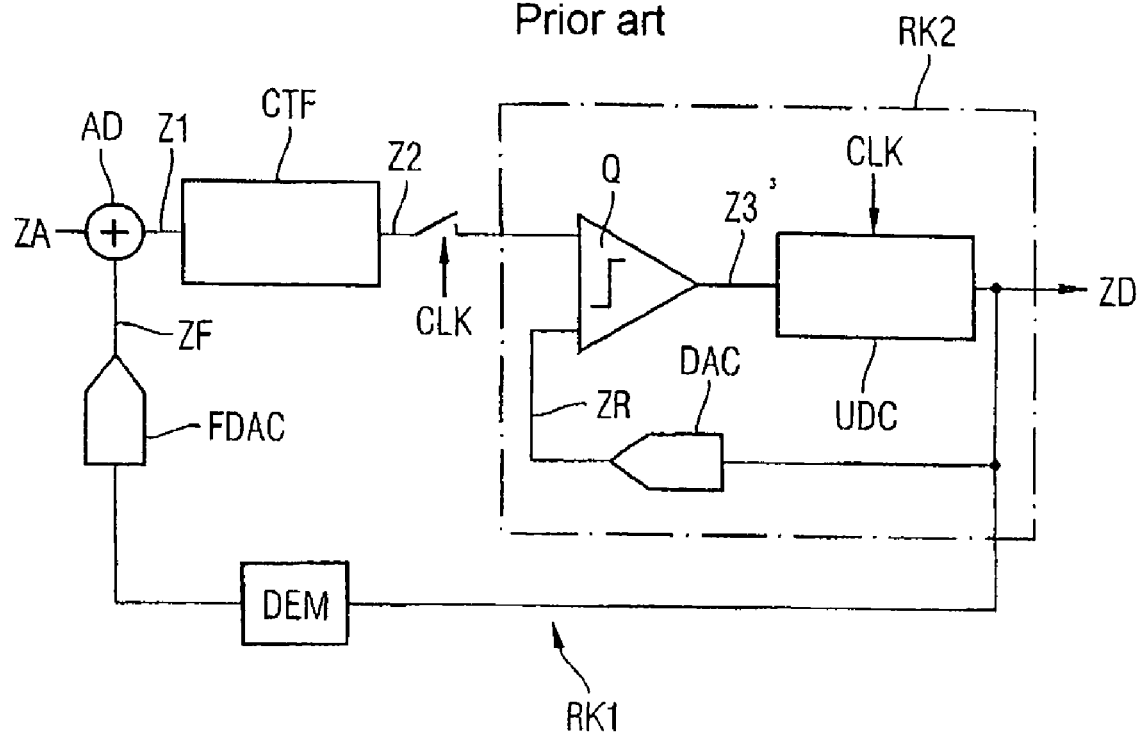
FIG. 1, as discussed above, is a conventional sigma-delta converter with two interconnected feedback control circuits.

Unless otherwise stated, elements that are the same or have equal functions have been provided with the same reference characters in the figures.

In a first embodiment of the invention, a starting circuit is used to provide stable starting of a circuit arrangement, such as a sigma-delta converter, having multiple feedback control circuits. The circuit arrangement has an output signal that is used as a control variable for its feedback control circuits. Furthermore, the starting circuit has a damping device that damps an input signal for the circuit arrangement for a predetermined time period during the starting phase of the circuit arrangement.

The damping, according to this embodiment, in the predetermined time period after the corresponding circuit arrangement is switched on, enables storage devices or capacitors or reference potentials in the circuit to be brought to a midpoint thus enabling the respective outer control loop to find a stable operating point. Due to the damping according to the invention, the input signal applied to the outer control loop differs only insignificantly from a midpoint value and the outer control loop is not disturbed by the inner control loop. A starting phase occurs, for example, on the initial switch-on of the circuit arrangement or on a reset.

The damping device may have at least one switched resistor. A shunt resistor of this kind damps the input signal by an amount depending on the particular resistance value. Several switched resistors enable the input signal to be damped in steps.

The damping device may have at least one transistor with a controlled path, with the controlled path having a controlled resistance value. In this case, the damping takes place continuously in the starting phase. This means that after the predetermined time period the controlled resistance value or corresponding damping can be ramped down if the respective outer control loop has already found its operating point.

In one embodiment of the inventive starting circuit, according to the invention, the circuit arrangement is timed by a clock signal and the starting circuit has a counting device that counts the clock periods. Therefore, the counting device can advantageously generate control signals for the damping device in response to the number of counted clock periods. After a predetermined number of clock periods, corresponding to the predetermined time period, the control signals then, for example, supply switching signals for the switched resistors or control signals for controlled paths of transistors.

In a further embodiment of the inventive starting circuit, a controlling device is provided that controls the counting device and/or the damping device depending on the output signal of the circuit arrangement. By means of this control of the damping in the starting phase of the circuit arrangement, other particularly unsatisfactory situations in the starting behavior can also be detected and rectified by a set damping. For example a new reset of the circuit arrangement and starting circuit to a basic state is possible if the output signal of the circuit arrangement indicates a blockage.

The circuit arrangement may be embodied as a sigma-delta converter with at least one summing device, a filter, a quantizer with comparators and a feedback digital-analog converter forming a first feedback control circuit and with a control logic, that controls the comparators depending on the output signal of the quantizer, forming a second feedback control circuit.

In one embodiment of the circuit arrangement being a sigma-delta converter, at least one summing device, a filter, a quantizer with comparators and a feedback digital-analog converter form a first feedback control circuit, and a control logic that applies a potential offset to an input signal of the quantizer depending on the ouput signal of the quantizer, forming a second feedback control circuit. In the latter case, the control logic preferably has a digital-analog converter.

The starting problems as explained in the introduction particularly occur with the form of an embodiment as a sigma-delta converter with a respective tracking quantizer. The starting circuit according to the invention on the other hand enables reliable starting without a blockage of the two interlinked feedback control circuits occurring.

Figure 2:
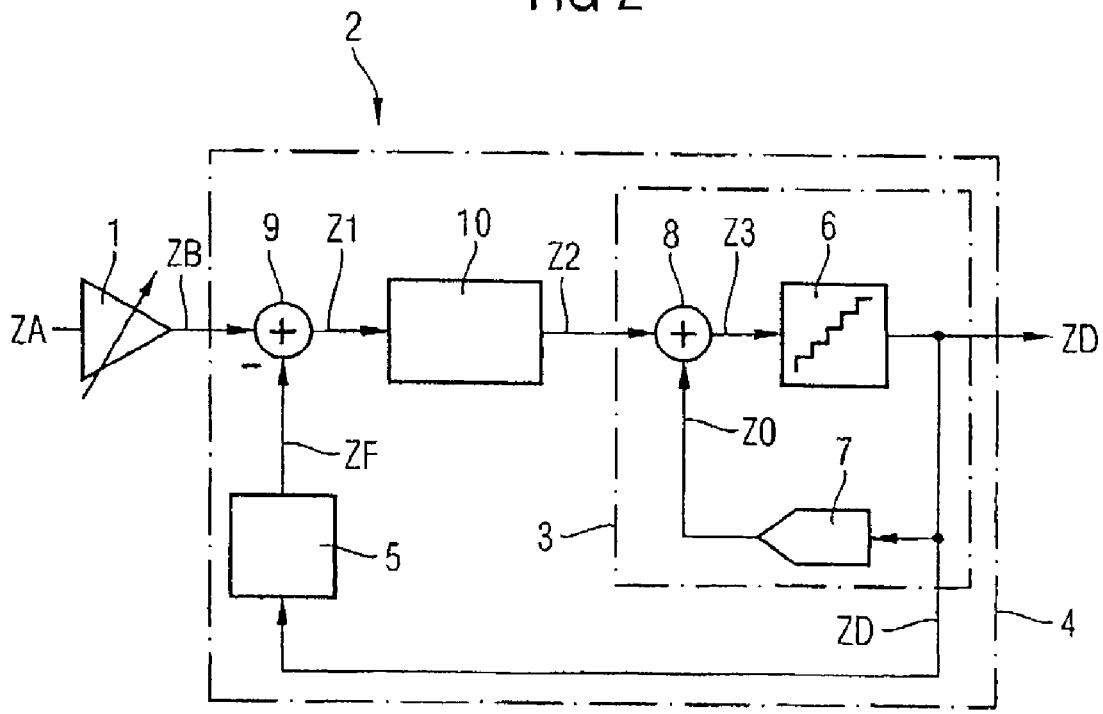
FIG. 2 is a circuit arrangement with a starting circuit.

FIG. 2 shows a block diagram of a sigma-delta converter with two interlinked feedback control circuits 3, 4. Furthermore, an analog input signal ZB is applied to the sigma-delta converter 2 and a digital output signal ZD is decoupled. The output signal ZD is used both as a control variable for a feedback digital-analog converter 5 and as a control variable for a tracking quantizer 6, 7, 8.

On the input side, a starting circuit 1 according to the invention is provided upstream of the sigma-delta converter 2. The starting circuit has a variable damping device that receives an input signal ZA and outputs said signal as a damped input signal ZB.

The sigma-delta converter 2 has a feedback digital-analog converter 5 that from the output signal ZD generates an analog feedback signal ZF that is subtracted from the input signal ZB by means of an adder 9. The signal Z1 thus obtained is applied to a filter 10, in this case a continuous-time filter. The corresponding filtered signal Z2 is applied via a further adder 8 to a quantizer 6 that supplies the digital output signal ZD. The quantizer 6 is, for example, formed with a bit width of several bits. A potential offset ZO, that is generated from the output signal ZD by a digital-analog converter 7, is applied to the adder 8 arranged upstream of the quantizer 6. A potential offset ZO, relative to the output signal of the quantizer ZD, is thus applied to the input signal of the quantizer 6. This ensures that the signal Z3 applied to the quantizer is always close to a relatively narrow converter window, which means that the quantizer 6 can be operated at a relatively small bit width, i.e. with only a few comparators, as, for example, is explained in more detail in published German application for patent No. 2004 030 812 A1 mentioned in the introduction.

During a starting phase, the setting of a stable operating point can be disadvantageously prevented by mutual blocking of the two feedback control circuits 3, 4, as described at the outset. The embodiment described herein avoids such a result. To this end, the starting circuit described herein damps, by means of the damping device 1, the input signal for a predetermined time period, strongly at first, e.g. −20 dB. In this way, it is possible to bring the counters potentially held in the quantizer 6, the converters 5, 7 and the filter 10 to a mid value and to bring other elements to a defined stable operating state. With a very small (damped according to the invention) input signal ZB, potential nodes provided in the circuit 2 are therefore first brought to a value that corresponds to a common-mode signal. The sigma-delta modulator control loop 4 can then find its optimum operating point without being disturbed by the inner control loop 3 for the tracking quantizer 6, 7, 8. This time period can be estimated thus enabling the damping to be reduced either in steps or continuously. Because the outer control loop 4 then has already found its operating point, it is also reliably possible according to the invention to specify the operating point for the inner control loop 3.

Figure 3:
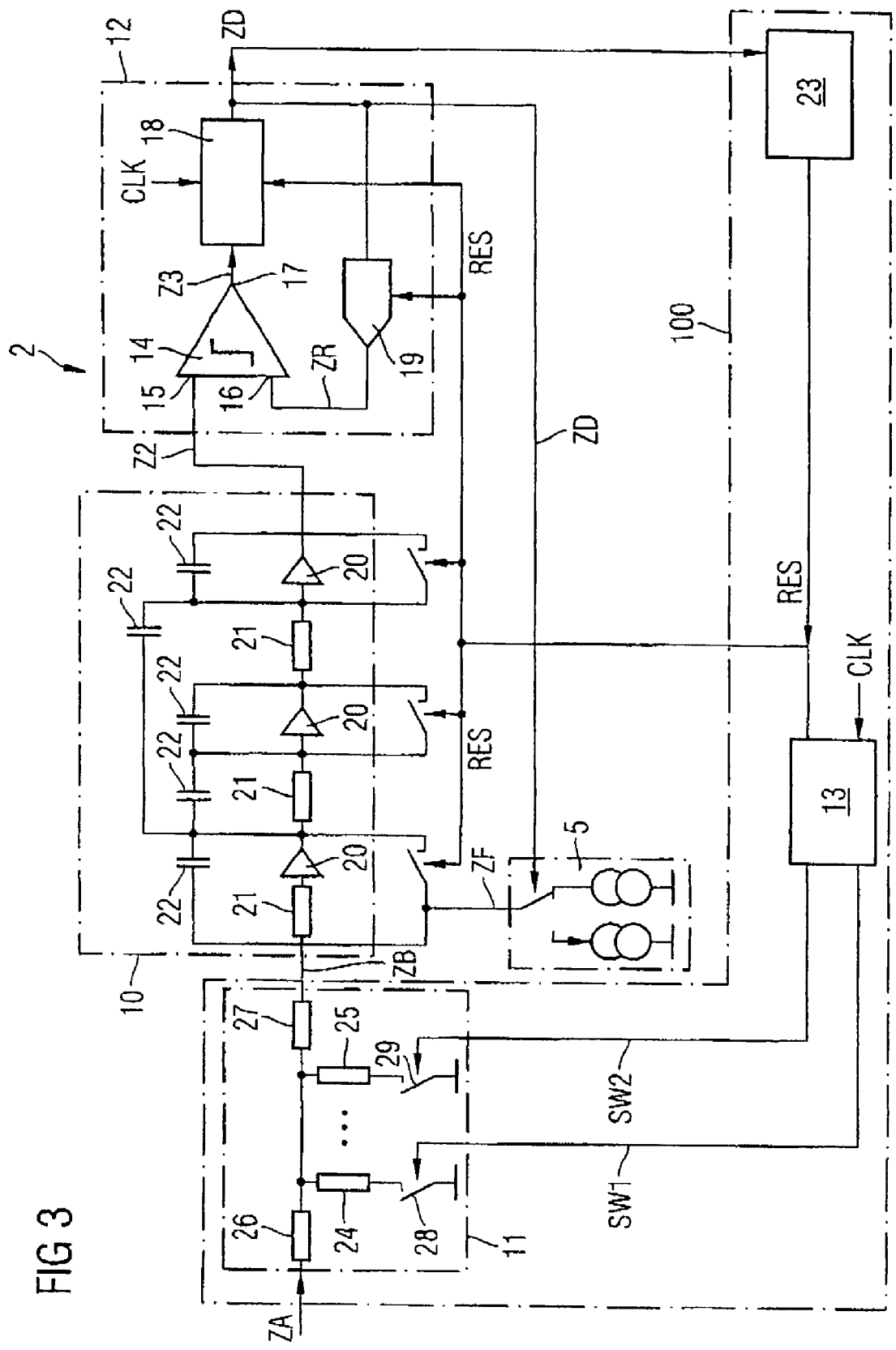
FIG. 3 is a schematic representation of a starting circuit for a sigma-delta converter.

FIG. 3 is a schematic representation of an embodiment of the invention.

This shows a starting circuit 11 according to this embodiment of the invention that is provided at the input end of a sigma-delta modulator and damps an analog input signal ZA during a starting phase. The sigma-delta modulator has a continuous-time filter 10, a quantizing device 12 and a feedback digital-analog converter 5. Furthermore, the filter 10, the quantizer 12 and the feedback digital-analog converter 5 that generates the feedback signal ZF, form a first feedback control circuit.

The quantizer device 12 is embodied as a tracking quantizer and in this case has, for example, a comparator 14 that has a comparison input 15, a reference input 16 and an output 17 and delivers a comparison result Z3. Downstream of this is a timed, resetable counting device 18 to which a clock signal CLK and a reset signal RES are applied. The counting device supplies the digital output signal ZD that is also supplied to a further digital-analog converter 19 that supplies a reference signal ZR to the reference input 16 of the comparator. The tracking quantizer thus forms a second feedback control circuit.

The filter 10 is, as shown in FIG. 3, formed from amplifiers 20 with a capacitive feedback from capacitors 22, and resistors 21. Furthermore, the filter 10 can likewise be initialised or reset by means of a reset signal RES.

The exemplary embodiment of the starting circuit 100 shown here has a controlling device 23 that picks up the digital output signal ZD and, relative to said output signal ZD, generates the reset signal RES that is applied to the filter 10, the quantizing device 12 and a counting device 13. The counting device 13 is timed by the clock signal CLK and generates control or switching signals SW1, SW2 for the damping device 11. The starting circuit in the exemplary example shown here therefore has the damping device 11, counting device 13 and controlling device 23.

The switching signals SW1, SW2 generated by the counting device 13 each switch a damping resistor 25, 26 at the input of the sigma-delta converter by means of controlled switches 28, 29. Stepped damping in each case relative to the resistance value of the switched resistors 24, 25 is thus possible. Furthermore, two resistors 26, 27 are provided in the signal path of the damping device 11.

The functioning of the starting circuit is described in more detail in the following, using signal curves that are shown in FIG. 4. FIG. 4 shows the time characteristic of an example of a clock signal CLK, of the reset signal RES, of the switching or control signals SW1, SW2, of the digital output signal ZD and of an analog input signal ZA assumed to be a sinusoidal curve.

Figure 4A:
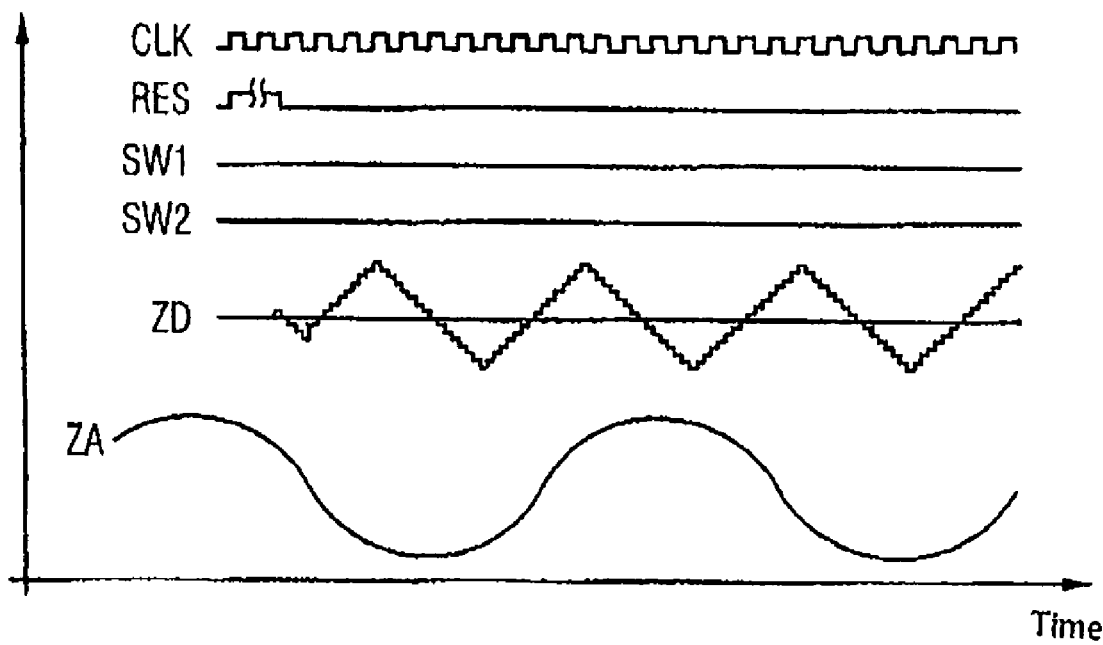
FIG. 4 are signal shapes of a sigma-delta converter with a starting circuit.

In FIG. 4A, no damping of the input signal according to the invention takes place in the starting phase. Therefore, resistors 24, 25 are not switched for damping. The corresponding control signals are at logic L. Therefore, practically the same signal shape of ZA, as shown in FIG. 4A, results for signal ZB at an input of the sigma-delta converter if there is also slight damping by resistors 26, 27. During the first two clock pulses, the reset signal RES is set to logic H and thus generates an initialization of the filter 10 and of the counter state of counter 18 and of counting device 13.

In the time period following the reset, the difficulty now arises that both the feedback control circuit in the tracking quantizer 12 and also that of the sigma-delta modulator itself must settle and find a stable operating point. As, however, already explained in the introduction, this is not possible quickly enough with the changing of the input signal ZA over time, so that the digital output signal ZD has practically no correlation to the input signal ZA and, for example, natural oscillation sets in.

Figure 4B:
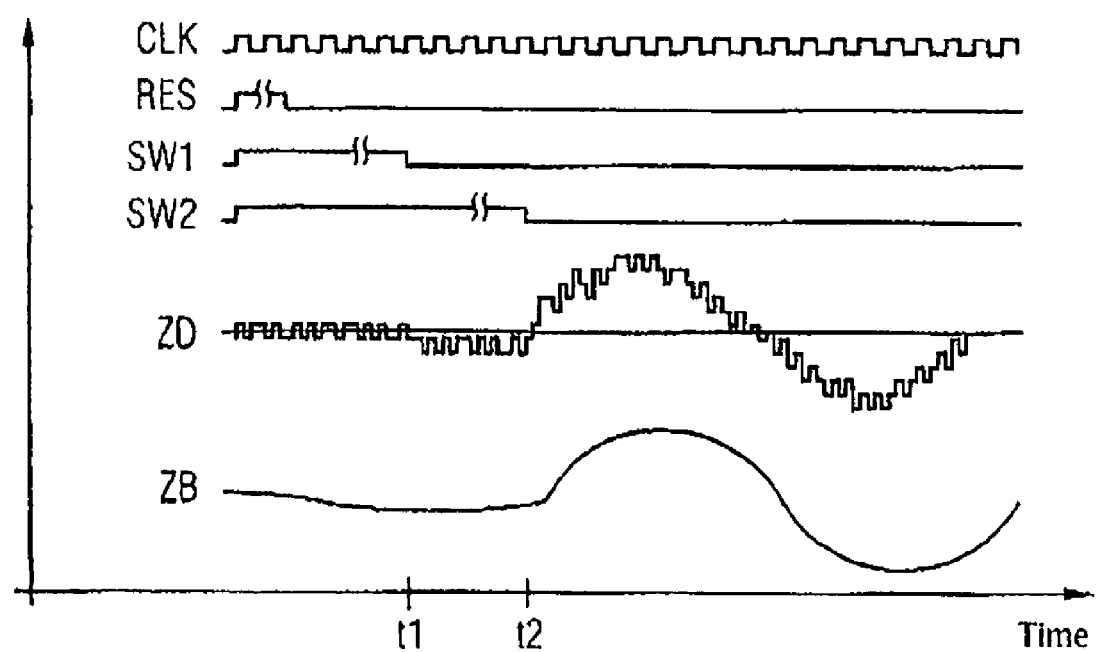

In contrast, according to the invention as shown in FIG. 4B, a fast setting of the operating point for both feedback control circuits, as shown in the circuit arrangement according to FIG. 3, takes place. FIG. 4B again shows the clock signal CLK and a reset signal RES set in the first two clock pulses. The counting device 13 counts the clock periods of the clock signal CLK and sets the switching signal SW1, shown here as an example, to logic H for a predetermined number of clock periods. At the same time, the second switching signal SW2 is at logic H. The switching signals SW1, SW2 control the controlled switches 28, 29 that switch the damping resistors 24, 25 to the input of the sigma-delta converter 2 and thus dampen the input signal ZA. FIG. 4B shows the correspondingly damped input signal ZB. Compared with the undamped signal ZA as shown in FIG. 4A, the level is initially damped, for example by 30 dB up to instant t1, corresponding to a first predetermined number of clock periods, and after instant t2 damped by only 20 dB, which corresponds to a further number of clock periods. The counting device 13 thus supplies the two switching signals SW1, SW2 depending on the number of counted clock periods.

This results in the signal shape of the digital output signal ZD shown in FIG. 4B. During the damping according to the invention, the level of input signal ZB is very low so that settling of the outer feedback control circuit of the sigma-delta modulation is achieved first. Because the input signal ZB runs close to a common-mode signal, the digital output signal fluctuates between a few bits by a zero value. Immediately the outer feedback control circuit of the modulator has found the stable operating point, the damping is ended, thus enabling the tracking quantizer to reliably find its operating point. For times >t2 a signal shape as shown in FIG. 4B therefore results.

The starting circuit 100 according to the invention, as shown in FIG. 3, also has a controlling device 23 that monitors the digital output signal ZD and generates a reset signal RES as necessary. A reset signal can be generated if, for example, the digital output signal ZD merely rises continuously over a predetermined number of clock cycles. The continuously rising output signal indicates an instability when finding the respective operating points. Therefore, control by means of the counting device 13 can be achieved as well as feedback control of the starting behavior by means of the controlling device 23. If settling does not occur, this can also be indicated, for example, by output signals that exhibit a constant maximum or minimum level over a long time period.

The invention therefore creates a starting circuit and a method for starting circuit arrangements with interconnected feedback control circuits that reliably guarantee that an operating point setting is achieved during the starting of all feedback control circuits. The starting circuit or method according to the invention is simple to implement and is independent of the actual design of the respective circuit arrangement.

Although this invention has been explained in more detail using some exemplary embodiments, it is not limited to these but instead can be modified in many ways. For example, other damping means for damping the input signal in the starting phase are possible. The invention is suitable not only for use in sigma-delta modulators but also can be used in any circuits with several feedback loops. The particular time period for damping during the starting phase need not be determined by a counting device but can, for example, also be available in stored form or be flexibly programmed. The examples of dampings of 20 and 30 dB mentioned can of course be adapted to the particular application. Although the exemplary embodiments are described using single-ended signal shapes, different forms of embodiment of the circuit arrangements according to the invention can of course be realised and used.

What is claimed is:

1. A starting circuit for a circuit arrangement that comprises interlinked feedback control circuits, wherein an output signal of said circuit arrangement is utilized as a control variable for said feedback control circuits, the starting circuit comprising:
   a damping device configured to damp an input signal of the circuit arrangement for a predetermined time period during a starting phase of said circuit arrangement,
   wherein said damping device comprises at least one switched resistor, at least one transistor comprising a controlled path that comprises a controlled resistance value, or at least one switched resistor and at least one transistor comprising a controlled path that comprises a controlled resistance value.

2. The starting circuit of claim 1, wherein said circuit arrangement is timed at least in part by a clock signal and wherein the starting circuit includes a counting device is configured to generate a count based on the clock signal.

3. The starting circuit of claim 2, wherein said counting device is configured to generate control signals for said damping device in relation to the count.

4. The starting circuit of claims 2, further comprising a controlling device configured to control the counting device.

5. The starting circuit of claims 1, further comprising a control device configured to control the damping device depending on the output signal.

6. The starting circuit of claim 1, wherein said circuit arrangement comprises a sigma-delta converter.

7. The starting circuit of claim 6, wherein the sigma-delta converter comprises at least one summing device, a filter, a quantizer with comparators, a feedback digital-analog converter, and a control logic, said at least one summing device, said filter, said quantizer with said comparators and said feedback digital-analog converter forming a first feedback control circuit, said control logic forming a second feedback control circuit, and said control logic configured to control the comparators depending on an output signal of said quantizer or said control logic applying a potential offset to an input signal of said quantizer depending on an output signal of said quantizer.

8. The starting circuit of claim 7, wherein said control logic comprises a further digital-analog converter.

9. An electronic circuit, comprising:
a circuit arrangement having at least two feedback control circuits, wherein an output signal of said circuit arrangement is utilized as a control variable for said feedback control circuits; and
a starting device comprising a damping device damping an input signal of said circuit arrangement for a predetermined time period during a starting phase of said circuit arrangement,
wherein said damping device comprises at least one switched resistor, at least one transistor comprising a controlled path that comprises a controlled resistance value, or at least one switched resistor and at least one transistor comprising a controlled path that comprises a controlled resistance value.

10. The circuit of claim 9, wherein said circuit arrangement is timed by a clock signal and said starting circuit comprises a counting device configured to generate a count based on the clock signal.

11. The circuit of claim 10, wherein said counting device is configured to generate control signals for said damping device in relation to the count.

12. The circuit of claim 10, further comprising a controlling device configured to control the counting device.

13. The circuit of claim 9, further comprising a controlling device configured to control the damping device depending on the output signal.

14. The circuit of claim 9, wherein said circuit arrangement is a sigma-delta converter.

15. The circuit of claim 14, wherein the sigma-delta converter comprises at least one summing device, a filter, a quantizer with comparators, a feedback digital-analog converter, and a control logic;

said at least one summing device, said filter, said quantizer with said comparators and said feedback digital-analog converter forming a first feedback control circuit, said control logic forming a second feedback control circuit, and said control logic configured to control said comparators depending on an output signal of said quantizer or said control logic configured to apply a potential offset to an input signal of said quantizer depending on an output signal of said quantizer.

16. The circuit of claim 15, wherein said control logic comprises a further digital-analog converter.

17. A method for starting a circuit arrangement, comprising the steps of:
utilizing an output signal of a circuit arrangement which comprises a plurality of feedback control circuits as a control variable for said feedback control circuits;
damping an input signal for said circuit arrangement for a predetermined time period during a starting phase of said circuit arrangement; and
controllably providing multiple degrees of damping of the input signal.

18. The method of claim 17, comprising damping said input signal depending on said output signal of said circuit arrangement.

* * * * *